US006493854B1

(12) United States Patent
Chowdhury et al.

(10) Patent No.: US 6,493,854 B1
(45) Date of Patent: Dec. 10, 2002

(54) METHOD AND APPARATUS FOR PLACING REPEATERS IN A NETWORK OF AN INTEGRATED CIRCUIT

(75) Inventors: Salim U. Chowdhury, Austin, TX (US); David Ray Bearden, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/411,725

(22) Filed: Oct. 1, 1999

(51) Int. Cl.[7] .............................................. G06F 17/50
(52) U.S. Cl. ...................... 716/6; 716/2; 716/8; 716/10; 716/12; 716/18
(58) Field of Search ........................ 326/108; 327/262; 716/2, 6, 8, 10, 12, 14, 18

(56) References Cited

U.S. PATENT DOCUMENTS 5,648,911 A * 7/1997 Grodstein et al. ............ 716/18
6,150,862 A * 11/2000 Vikinski ...................... 327/262
6,163,174 A * 12/2000 Friedman et al. ........... 326/108

OTHER PUBLICATIONS

Chen et al., "Noise–aware Repeater Insertion and Wire Sizing for On–Chip Interconnect Using Hierarchical Moment–Matching," 36th Design Automation Conference, pp. 502–506 (1999).

Alpert et al., "Buffer Insertion With Accurate Gate and Interconnect Delay Computation," 36th Design Automation Conference, pp. 479–484 (1999).

Lillis et al., "Original Wire Sizing and Buffer Insertion for Low Power and a Generalized Dela Model," IEEE, pp. 437–447 (1996).

* cited by examiner

Primary Examiner—Matthew Smith
Assistant Examiner—Thuan Do
(74) Attorney, Agent, or Firm—James L. Clingan, Jr.

(57) ABSTRACT

A method of inserting repeaters into a network to improve timing characteristics of the network. Extraction and timing tools provide an RC network description and a slack report describing electrical and timing characteristics of a network. The timing characteristics include required arrival times of a signal generated at a source to each of the sinks of the network. A maximum slew rate is also defined at each of the sinks. Initial candidate locations for insertion of repeaters is determined. For a given set of legal repeater sizes, one or more sets of midvalue repeater sizes are determined which are used in successive approximation to identify actual repeater sizes to be considered at each of the candidate locations. At each candidate location, capacitance, required arrival time, and slew rate value (c, q, s) are determined in a bottom-up procedure. Suboptimal and invalid (c, q, s) choices at each candidate location are eliminated during successive iterations of the bottom-up procedure until the source node is reached. Further, one or more of the candidate locations are also eliminated. When the source device is reached, the (c, q, s) values are determined at the source for the given size of the source. The particular combination of (c, q, s) values at the descendant nodes relative to the source that provide a maximum q value at the source are selected, and this procedure is repeated in a top-down traversal to identify the best solution for the net for the particular repeater sizes being used.

4 Claims, 6 Drawing Sheets

METHOD AND APPARATUS FOR PLACING REPEATERS IN A NETWORK OF AN INTEGRATED CIRCUIT

FIELD OF THE INVENTION

The present invention relates to integrated circuit design and more particularly to inserting repeaters in a single source, multi destination distributed RC network for reducing delay.

DESCRIPTION OF THE RELATED ART

Repeater insertion has become an important tool for present day design of integrated circuits (IC). Delays in a long interconnect in an IC can be reduced only to a certain extent by having a large driver. As the signal propagates through the resistive interconnect, signal attenuation causes the delay per unit length to increase. Insertion of the repeaters along the interconnect restore strength of the signal at the output of the repeater to the power rail level, thus reducing delay. Repeater insertion also restores signal strength in nets with a large fan-out in which a single source attempts to drive a large number of destinations, otherwise referred to as sinks. Interconnect delay cannot be reduced indefinitely by inserting a large number of repeaters. This is because the signal experiences an intrinsic delay of the repeater while propagating through the repeater. Thus, there is an optimum number of repeaters which achieves the minimum delay.

As used throughout this disclosure, a repeater is a buffer that can be either inverting or non-inverting. Usually, a pre-designed repeater library is used comprising any number of available buffers with corresponding sizes. Thus, repeater sizes are discrete in the library and are not continuous. Different size repeaters offer different intrinsic delays, input loading and drive capabilities. In a general situation, the most delay reduction is obtained by placing different size repeaters at different places in a net.

A large category of interconnects comprises a single driver that connects to multiple sinks. The topology of the interconnections between a single driver, otherwise referred to as a root or source, and the sinks to which the root is connected is usually referred to as a tree. Repeater insertion into a tree structure may be achieved by solving two sub problems. The first problem is locating places along the tree where repeaters will be placed. The second problem is determining the sizes of the repeaters to be placed at the selected locations.

One researcher has proposed a dynamic programming methodology for inserting repeaters in a tree structure. A bottom-up approach is utilized to select a subset of given locations on the tree to place repeaters. During the bottom-up traversal, candidate locations are visited one by one. At each candidate location, all possibilities are considered such as not placing a repeater or placing a repeater from all of the available sizes. These choices give rise to a partial solution set. A technique is further identified to identify the partial solutions which are sub optimal for the complete solution. The sub optimal solutions are pruned or otherwise rejected. The rest of the solutions are propagated up the tree. The bottom-up traversal is followed up by a top-down traversal which provides the optimal solution.

The technique just described attempts to reduce Elmore delay. Elmore delay is known to be an upper bound for the actual delay in RC networks. The above described technique however fails to adequately account for controlling the signal slew rate or the rise/fall times of the signal. Although minimizing critical delays are important, other factors such as controlling slew rate have become equally critical in today's sub-micron IC technologies. Repeater insertion helps to maintain good signal slew rate because the inserted repeaters restore signal strength. However, in certain situations, repeater insertion minimizes the delay in a critical path by isolating a non-critical path with a small-sized repeater placed in the non-critical path. As a result, repeater insertion may aggravate signal slew rate. It is important to explicitly consider the signal slew rate while inserting repeaters for minimizing critical delays.

Incorporating slew rate to obtain an accurate delay model is not straight forward. Slew must be propagated from the input of the driver to the sinks. But since repeaters along the RC tree have not yet been placed and sized, an input slew cannot be propagated.

Extension to the above described method have been proposed to include slew rate. In one technique, repeater sizes and wire widths are considered simultaneously to optimize the Elmore day. The basic algorithm is extended to include slew rate and to optimize power. Although the slew rate is not computed explicitly, the contribution of non-zero slew in the delay model is incorporated. The slew rate at the input of a given stage is assumed to be proportional to the delay in the previous stage. The slew rate is incorporated by adding an additional delay component that is a function of the delay in the previous stage and the repeater size in the current stage. The slew model, however, introduces additional complication in the basic algorithm. The delay in the previous stage is not known during a bottom-up traversal of the tree. Thus identifying and eliminating sub optimal solutions must be deferred thereby increasing the memory and run time complexity.

Other approaches to include slew rate have been proposed. In one solution, a moment based accurate delay model is used to allow for slew. However, since the slew is not known at the input of a repeater being inserted at a candidate location, it is assumed that the input slew is a given constant. This technique is determined to be inadequate since it is known that slew is variable and not constant. Another more rigorous approach was also proposed. Moment based computations are utilized to obtain transfer functions and loading effects for accurate RC modeling. Transfer functions are computed in a bottom-up traversal for different segments of the RC tree. Since the delay due to these accurate transfer functions are not additive, unlike the Elmore delay, convolution of transfer functions are needed to obtain a delay in a path containing more than a single segment. Furthermore, since slew rate at the input of a repeater is not known, the delay is computed for an array of slew rate values. Thus, pruning sub optimal solutions must be deferred. This technique, therefore, is not desirable since it is computation intensive requiring substantial computer resources for circuits of any significant size.

It is desired to provide a technique to place repeaters in a network to reduce delay and properly account for slew rate. It is desired to provide an approach that is not computationally intensive. Further, it is desired to reduce the number of inserted repeaters to a practical level, since repeaters consume valuable power and real estate on the IC.

BRIEF DESCRIPTION OF THE DRAWINGS

A better understanding of the present invention can be obtained when the following detailed description of the preferred embodiment is considered in conjunction with the following drawings.

DETAILED DESCRIPTION OF THE PREFERRED EMBODIMENT(S)

Figure 1:
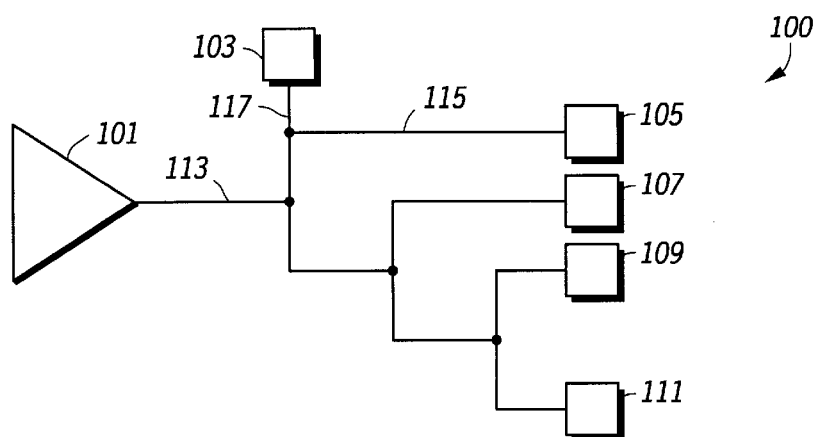
FIG. 1 is a schematic diagram of an exemplary network or net used to illustrate repeater insertion according to the present invention.

FIG. 1 is a schematic diagram of a network or net 100 that is used to illustrate repeater insertion in accordance with the present invention. As shown, a root or source device 101 drives a signal to be received by a plurality of receivers or sinks, including sinks 103, 105, 107, 109 and 111. Signal traces 113 are routed between the source device 101 and each of the sinks 103–111 (103–111). In a practical embodiment, the signal traces 113 are often divided into a plurality of segments, where some of the segments are longer than others. For example, two segments 115 and 117 route the signal to sinks 103 and 105, respectively, where signal trace segment 115 is substantially longer than the trace segment 117.

The signal traces 113 have certain physical characteristics which may be represented by resistive and capacitive (RC) components as further described below. Such characteristics cause delay and degradation of the signal asserted by the source 101. Each of the sinks 103–111 have certain timing specifications including a required arrival time, referred to as "q" relative to the source device 101 and further including a maximum allowable slew rate, referred to as $S_{MAX}$, that must be met to insure proper operation of the net 100. For example, each of the sinks 103–111 may require a slew rate of several hundred picoseconds (ps) for proper operation. Also, the sink 103 may require a delay relative to the source device 101 of 200 ps whereas the sink 107 requires a signal arrival time or delay of no more than 100 ps. Although an integrated circuit (IC) designer may attempt to place the components and route the signal traces in a optimal manner, the IC may be operated at a significantly high clock rate such that the timing specifications are still not met within the net 100. For this reason, one or more repeaters may be inserted at candidate locations within the net 100 to reduce delay and to improve signal characteristics to insure that the timing specifications are met.

Figure 2:
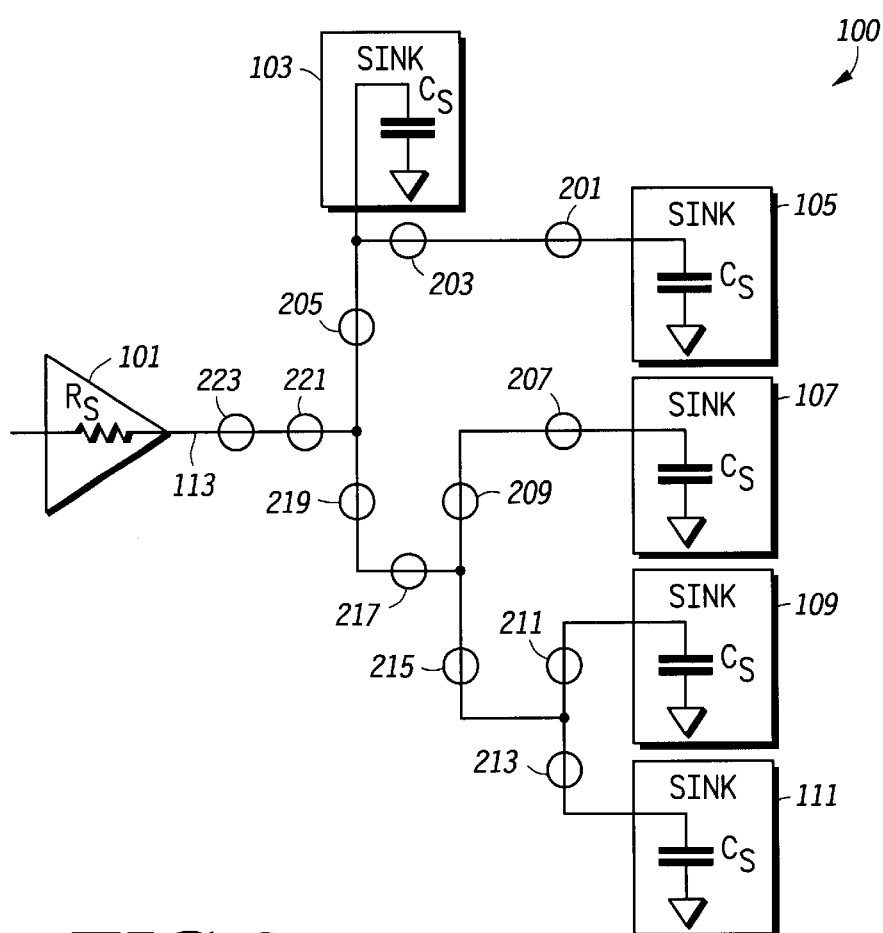
FIG. 2 is a schematic diagram of the net of FIG. 1 further showing RC characteristics of the source and sinks and further showing candidate repeater locations.
Figure 3:
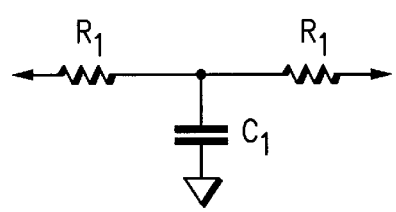
FIG. 3 is an RC T-section schematic diagram representing RC characteristics of any of the segments or subsegments of the signal traces of the net illustrated in FIG. 1.

FIG. 2 is a schematic diagram of the net 100 of FIG. 1 further showing RC characteristics of the source device 101 and the sinks 103–111 and further showing a plurality of potential candidate locations 201, 203, 205, 207, 209, 211, 213, 215, 217, 219, 221, 223 (201–223) along the signal traces 113 for placement of repeaters. The source device 101 may be represented by a source resistor $R_s$ and each of the sinks 103–111 are represented by a capacitance $c_s$. The initial candidate locations 201–223 are generally determined in some manner for possible placement of a repeater to overcome the RC characteristics along the various segments of the signal traces 113. FIG. 3, for example, is an RC T-section schematic diagram representing the RC characteristics of any of the segments or subsegments of the signal traces 113. In the RC T-section representation, two equivalent resistors $R_1$ are coupled in series to represent series resistance of the representative segment and a capacitance $c_1$ is shown coupled between the junction of the two resistors $R_1$ and ground. A repeater at any one or more of the candidate locations 201–223 shown in FIG. 2 is used to overcome the RC characteristics of the signal traces 113 in order to meet the timing specifications of the sinks 103–111 of the net 100.

In one embodiment, the initial candidate locations 201–223 are determined based on practical considerations such as the RC characteristics of the signal traces 113 used in the net 100. For example, an arbitrary threshold value such as 50 femtofarads ($10^{-15}$ farads) is used to determine the separation of each of the initial candidate locations 201–223 along the traces 113.

Figure 4:
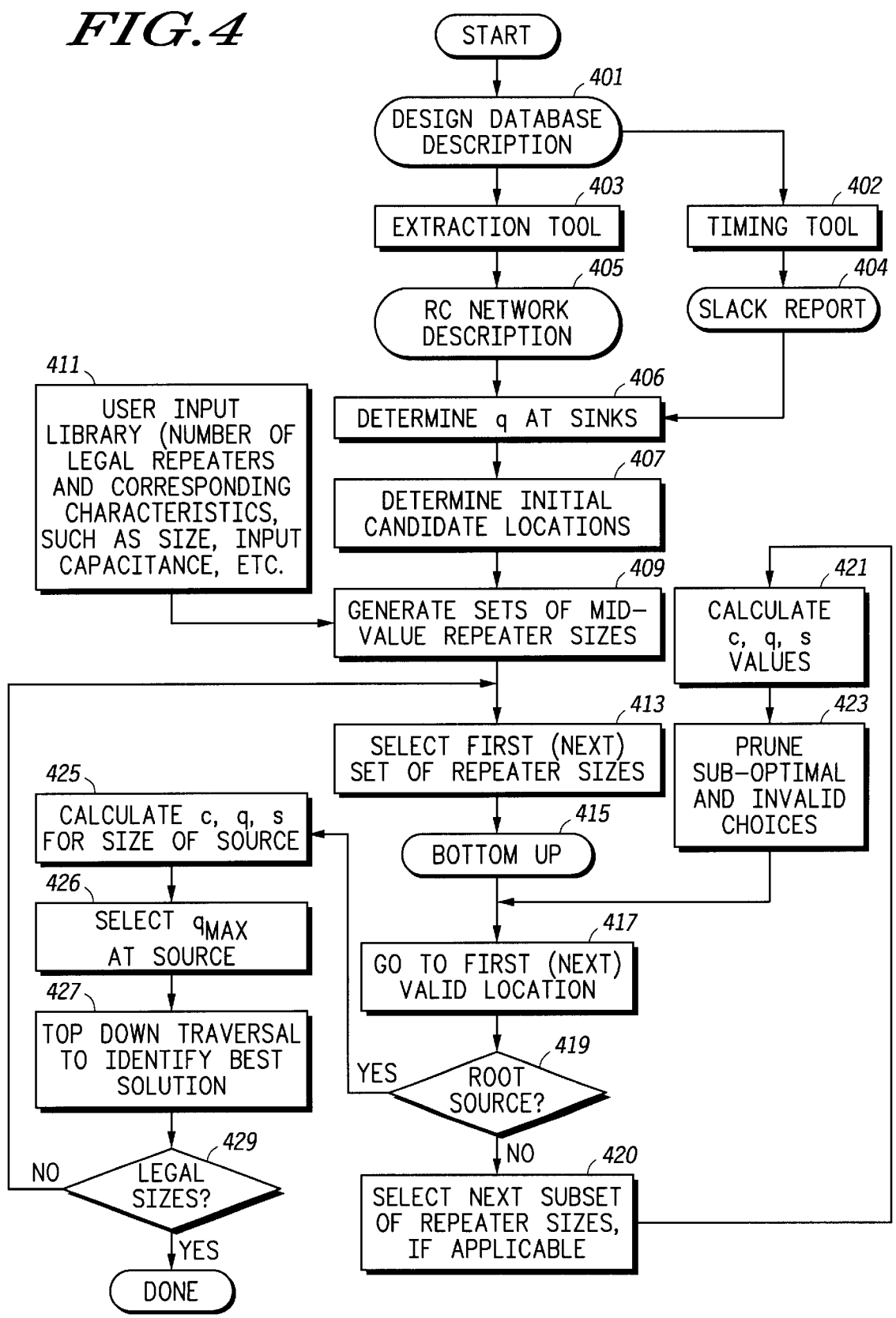
FIG. 4 is a flow chart diagram illustrating a method of repeater insertion according the present invention.

FIG. 4 is a flow chart diagram of an exemplary method utilized to choose among the candidate locations 201–223 for placement of repeaters and further to determine the appropriate size of the repeaters to be inserted. A first block 401 represents a design database description of a net, such as the net 100, to be examined for repeater insertion. The design data base description is provided to an extraction tool at block 403, which provides an RC network description of at least one net as shown at block 405. Meanwhile, the design database description is also provided to a timing tool as shown at block 402, which generates a slack report as shown at block 404. The slack report identifies an amount of delay from the source device 101 and each of the sinks 103–111, and provides slack values indicative of whether the delay is sufficient to meet the timing requirements at the respective sinks 103–111. A negative slack value indicates that the timing has not been met by an amount of time equal to the magnitude of the slack value. The slack report and the RC network description are then utilized to determine required arrival times, referred to as "q" values, at each of the sinks 103–111, as shown at block 406. At next block 407, the candidate locations of a net, such as the initial candidate locations 201–223 of the net 100, are determined based on the RC network description of the input net. The candidate locations 201–223 are selected based on any desired criteria, such as a threshold amount of capacitance along the signal traces 113 as previously described.

At next block 409, one or more sets of midvalue repeater sizes are calculated based upon an input set of legal or actual repeater sizes. As shown at block 411, a user input library is utilized which includes a certain number of actual repeaters with corresponding sizes as well as other characteristics, such as input capacitance. The input library of repeaters at block 411 is utilized at block 409 to generate the sets of midvalue repeater sizes. It is noted that since the input library represents the entire set of available repeater sizes, any midvalue repeater sizes generally are not legal and thus represent imaginary or theoretical repeaters. As will be shown, the use of the midvalue repeater sizes enables faster determination and selection from among the actual repeaters from the user library. In at least one embodiment, the midvalue repeater sizes enable a successive approximation technique to either eliminate the consideration of a repeater or to select the appropriate one of the legal repeater sizes.

Figure 5:
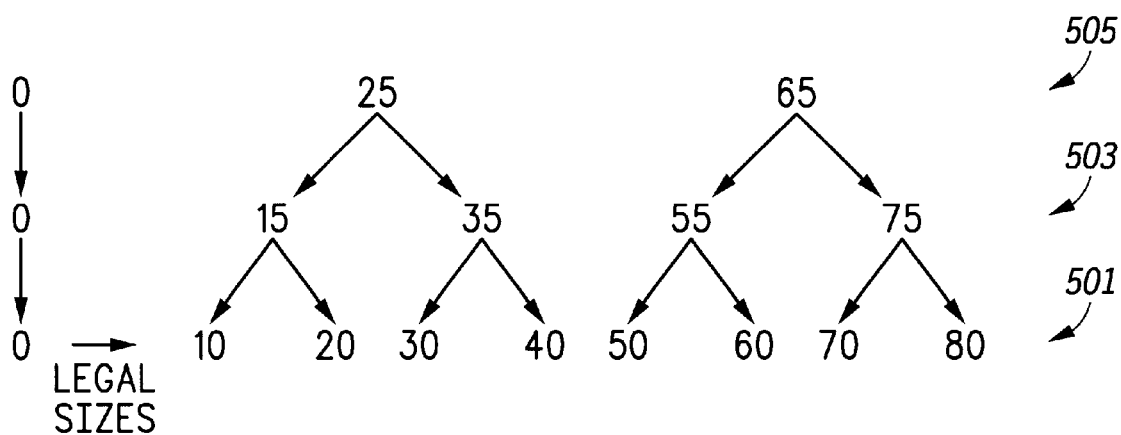
FIG. 5 is a numeric diagram illustrating an exemplary set of legal repeater sizes and further illustrating sets of mid-value repeater sizes based on the legal sizes.

FIG. 5 is a numeric diagram illustrating an exemplary set of legal repeater sizes and several sets of midvalue repeater sizes. As shown, eight legal repeater sizes 10, 20, 30, 40, 50, 60, 70, and 80 are shown along the bottom of the diagram as part of a set of legal repeater sizes 501. A value of zero (0) at the far left is included in the set of legal repeater sizes 501 to represent no repeater. In this embodiment, each pair of valid repeater sizes is combined to calculate a midvalue repeater size of a set of midvalue repeater sizes 503. In particular, repeater sizes 10 and 20 are combined to generate a midvalue repeater size of 15. Likewise, pairs 30 and 40, 50 and 60, and 70 and 80 are combined to generate midvalue repeater sizes 35, 55 and 75, respectively, for the set of midvalue repeater sizes 503. The set of midvalue repeater sizes 503 thus includes four imaginary repeater sizes 15, 35, 55 and 75 along with a zero (0) value at the left indicating selection of no buffer. Since, in this embodiment, it is desired to further reduce to a pair of values, each consecutive pair of the set of midvalue repeater sizes 503, other than zero, is further combined to generate another midvalue repeater size for a third set of midvalue repeater sizes 505. In particular, the midvalue sizes 15 and 35 are combined to generate another midvalue size 25, and the midvalue sizes 55 and 75 are combined to generate another midvalue size 65 for the set of midvalue repeater sizes 505. Again, the set of midvalue repeater sizes 505 includes a zero value representing no repeater. Since the set of midvalue repeater values 505 includes only two midvalue sizes other than zero, the procedure is complete.

Each of the sets of legal or midvalue repeater sizes may further be divided into subsets of sizes. An exception is the highest set of midvalue repeater sizes, which itself is a subset. The arrows extending from each midvalue repeater size indicate a corresponding subset of repeater sizes within the next lower set of midvalue sizes. For example, for the midvalue size 65 of the set 505, the corresponding subset of the set 503 includes the midvalue repeater sizes 55 and 75. As described further below, the sets 505, 503 and 501 are considered in that order in which only the repeater sizes of the current set are considered. Thus, in the first iteration, only the repeater sizes 0, 25 and 65 are considered at each of the candidate locations. In the next and subsequent iterations, only the corresponding subsets in the next set of repeater sizes are considered for each selected midvalue size. For example, if a repeater size of 65 is chosen during the first iteration at a candidate location, then only the values 55 and 75 are considered in the next iteration. If no repeater is selected, represented as zero, then the candidate location is rejected and remains zero in the subsequent iterations.

It is noted that the set of legal repeater values 501 is the only valid set. The set of midvalue repeater sizes 503 and 505 do not include valid repeater sizes (other than zero) contained within the user input library. However, as further described below, each midvalue within each set of midvalue repeater sizes 505 and 503 is utilized in successive iterations to ultimately arrive at one of the valid repeater sizes in the set of legal repeater sizes 501. It is noted that the combining method used in FIG. 5 is averaging so that the legal values 10 and 20 are averaged to 15, the values 30 and 40 are averaged to 35 and the values 15 and 35 are averaged to the value 25. However, any type of appropriate combining technique may be utilized, where averaging is a simple and convenient technique to arrive at an acceptable solution.

Figure 6:
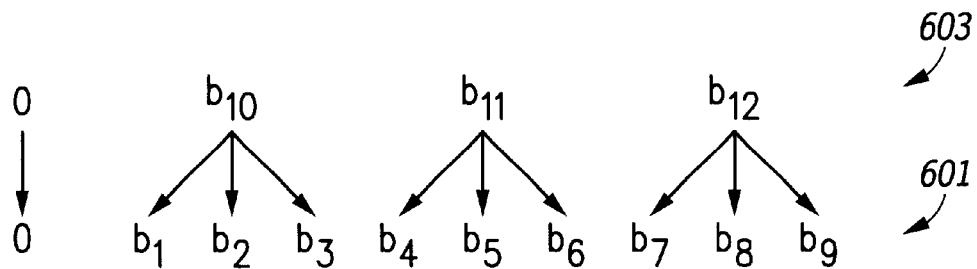
FIG. 6 is a diagram illustrating determination of midvalue repeater sizes for any plurality of valid repeater sizes.

FIG. 6 is a diagram illustrating determination of midvalue repeater sizes for a plurality of valid or legal repeater sizes 601, specifically labeled $b_1, b_2, b_3 \ldots b_9$, according to another embodiment. In this exemplary embodiment, more than two, such as three, of the actual repeater sizes are combined to arrive at each midvalue size. In particular, repeater sizes $b_1, b_2$ and $b_3$ of the set of legal repeater sizes 601 are combined to generate a midvalue size $b_{10}$ of a set of midvalue repeater sizes 603. Likewise, legal repeater sizes $b_4, b_5$ and $b_6$ are combined to generate a midvalue size $b_{11}$, and repeater sizes $b_7, b_8$ and $b_9$ are combined to generate a midvalue repeater size $b_{12}$. Again, zero values are shown on the left side for each set. In this case, three repeater sizes are adequate so that as operation is complete after calculation of the set of midvalue repeater 603. FIG. 6 illustrates that repeater value combination is not necessarily limited to pairs of repeater size values but may be generalized so that any desired number of repeater sizes may be combined to generate each midvalue size. The arrows from each midvalue repeater size are used in the same manner as described for FIG. 5 to indicate corresponding repeater size subsets in the next set of sizes.

Figure 7:
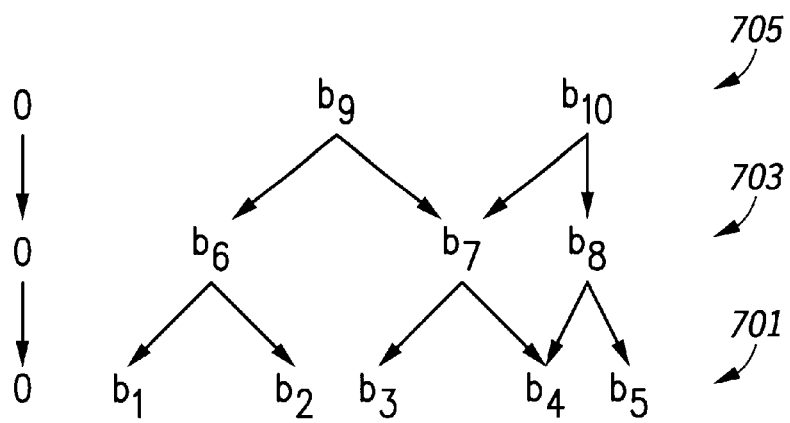
FIG. 7 is a diagram illustrating combination of pairs of an odd number of legal repeater sizes to generate multiple sets of midrange repeater sizes.

FIG. 7 is a diagram illustrating combination of an odd number of legal repeater sizes to generate multiple sets of midrange repeater sizes. In particular, legal repeater sizes $b_1, b_2, b_3, b_4$ and $b_5$ comprise a first set of legal repeater sizes 701. The legal repeater sizes $b_1$, and $b_2$ are combined to generate a midvalue size $b_6$. The next pair of legal repeater sizes $b_3$ and $b_4$ is combined to generate another midvalue size $b_7$. Since only a single legal repeater size $b_5$ remains, it is combined with the previous valid repeater size $b_4$ to generate a midvalue size $b_8$. Thus, a second set of midvalue repeater sizes 703 is generated including midvalues $b_6, b_7$ and $b_8$, along with a zero value. Since the set of midvalue repeater sizes 703 still includes three sizes and it is desired to further reduce to two sizes, the midvalue sizes $b_6$ and $b_7$ are further combined to a new midvalue size $b_9$ and the midvalue sizes $b_7$ and $b_8$ are combined to determine a new midvalue size $b_{10}$. Thus, a new set of midvalue repeater sizes 705 is created comprising midvalue repeater sizes $b_9$ and $b_{10}$ and a zero size. Since the repeater sizes have been reduced to a pair of midvalue repeater sizes, operation is complete. The arrows extending from each midvalue repeater size are used in the same manner as described for FIG. 5 to indicate corresponding repeater size subsets in the next set of sizes.

Referring back to FIG. 4, after the sets of midvalue repeater sizes are determined at block 409, operation proceeds to next block 413 in which the first or next set of repeater sizes are selected. Such selection is performed top down. In particular, for eight repeaters of legal sizes 10–80 as shown in FIG. 5, the set of midvalue repeater sizes 505 comprising zero and midvalues 25 and 65 are selected first. For the set of legal repeater sizes 601 as shown in FIG. 6, the set of midvalue repeater sizes 603 is selected first. Similarly, for the set of legal repeater sizes 701 shown in FIG. 7, the set of midvalue sizes 705 is selected as the first set of repeater sizes at block 413.

Block 415 in FIG. 4 generally denotes initiation of a bottom up traversal of the input net, such as the net 100, for determining if a repeater is to be placed at any of the initial repeater locations 201–223 and, if so, for selecting an appropriate repeater size. At next block 417, the first or next remaining candidate location is selected. For the first pass of a net such as the net 100, all of the candidate locations 201–223 are considered. However, during the second and subsequent iterations of the bottom up procedure, certain locations may be eliminated. It is noted that any of the bottom-most of the initial candidate locations 201–223 may be selected first. For example, any of the candidate locations 201, 207, 211 and 213 adjacent to the sinks 105, 107, 109, 111 respectively may be selected as the first candidate location. In particular, the candidate location 201 may be selected first followed by the candidate locations 203 and 205. However, the candidate location 219 must be determined prior to calculating values at the candidate location 221. Before considering the candidate location 219, however, the candidate location 217 must be determined, which in turn may not be considered until after the candidate locations 209 and 215 are considered. As an example, candidate locations 201, 203 and 205 could be considered in order followed by candidate locations 207 and 209, then followed by candidate locations 211 and 213. After consideration of candidate locations 211 and 213, candidate location 215 may then be considered followed by candidate location 217 since the candidate locations 209 and 215 have already been considered. After consideration of the candidate location 217, candidate location 219 may then be considered followed by candidate location 221 and then 223. In this manner, each of the candidate locations are considered in a bottom-up traversal of the net 100.

At next block 419, it is determined whether the root or source device of the net has been reached. For the net 100, after consideration of the initial candidate location 223, the next remaining location determined at block 417 would be the source device 101. If the source device 101 has not been reached, operation proceeds to block 420 in which the first or next "subset" of the set of legal or midvalue repeater sizes is considered for the current set of repeater sizes. The first set of midvalue repeater sizes effectively is a subset so that this step is not necessary in the first iteration. During subsequent iterations, however, at each location in which a midvalue repeater size has been selected from a given set of midvalue repeater sizes, the corresponding subset of the next set of legal or midvalue repeater sizes is used. The arrows extending from each midvalue size in FIGS. 5, 6 and 7 indicate the corresponding subset of repeater sizes as previously described. Operation then proceeds to block 421, where one or more sets of capacitance "c", signal arrival times "q", and slew rates "s", referred to as (c, q, s) values, are determined for the particular candidate location being considered.

Figure 8:
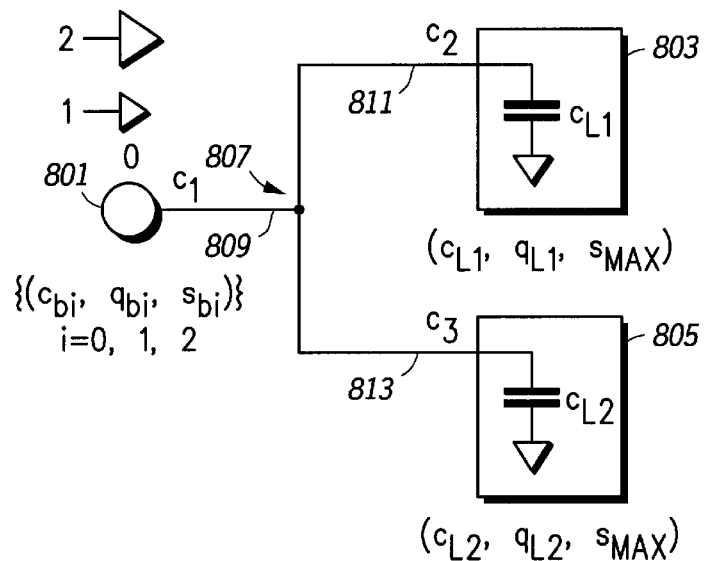
FIG. 8 is a schematic diagram illustrating exemplary calculation of one or more sets of capacitance, arrival time, and slew rate at a candidate location based on descendant sink nodes.

FIG. 8 is a schematic diagram illustrating exemplary calculation of one or more sets of (c, q, s) values at a candidate location 801 based on descendant leaf nodes or sinks 803 and 805. The sinks 803 and 805 are connected to the candidate location 801 via signal traces 807 comprising trace segments 809, 811 and 813. The capacitive load at the sink 803 is referred to as $C_{L1}$ and the capacitive load at sink 805 is referred to as $C_{L2}$. Likewise, a required signal arrival time $q_{L1}$ is needed at the sink 803 and a required signal arrival time $q_{L2}$, is required at the sink 805. Each of the sinks 803, 805, have a maximum slew rate referred to as $S_{MAX}$. It is noted that the maximum slew rate is approximately the same for each sink. If the maximum case slew rates were different, however, then the worst case maximum slew rate of the sinks 803, 805 would be selected to ensure that the maximum required slew rate is met at both sinks.

In the general case, a plurality of repeater sizes, referred to as B, is to be considered at the candidate location 801. Each repeater also incorporates respective drive strengths and input capacitance. For B repeaters, there are B+1 choices including B choices for placing any one of the B repeater sizes and one choice for placing no repeater at all at candidate location 801. The choices are represented by an index "i" where i varies from 0 to B. In the embodiment shown in FIG. 8, only two buffers are considered, a small buffer size 1 and a large buffer size 2. Zero (0) represents placement of no buffer at all. In this case, i varies from 0 to 2 so that three sets of c, q and s values are determined at the candidate location 801, referred to as ($c_{bi}$, $q_{bi}$, $S_{bi}$)

The solution i=0 represents placing no repeater at all. The capacitance $c_{b0}$ is a straight forward calculation $c_{b0}=c_1+c_2+c_3+c_{L1}+c_{L2}$, where $c_1$, is the equivalent capacitance for signal trace 809, $c_2$ is the equivalent capacitance for trace segment 811, and $c_3$ is the equivalent capacitance for trace segment 813. For repeater size 1, the corresponding capacitance is determined to be the input capacitance of repeater 1. Likewise, for repeater 2, the capacitance is determined to be the input capacitance of repeater 2.

The required arrival time $q_{bi}$ at the candidate location 801 is the lesser of two separate arrival times, each dictated by the corresponding arrival times $q_{L1}$ and $q_{L2}$. For each of the i choices of repeaters including no repeater, two separate delay values are calculated, one delay value between the candidate buffer 801 and the sink 803 and another delay value between the candidate location 801 and sink 805. The two respective delay values are subtracted from the respective required arrival times $q_{L1}$ and $q_{L2}$ at sinks 803, 805, respectively, to calculate the two possible required arrival times at the candidate location 801. The lesser of these two possible required arrival times is selected as the required arrival time $q_{bi}$ at the candidate location 801 for the given choice i. In summary, for each of the B+1 choices including no repeater, two delay values are calculated, a first between the candidate location 801 and the sink 803 and another between the candidate location 801 and the sink 805. For consideration of a particular repeater, the characteristic resistance of the repeater is inserted at the candidate location 801.

Figure 9:
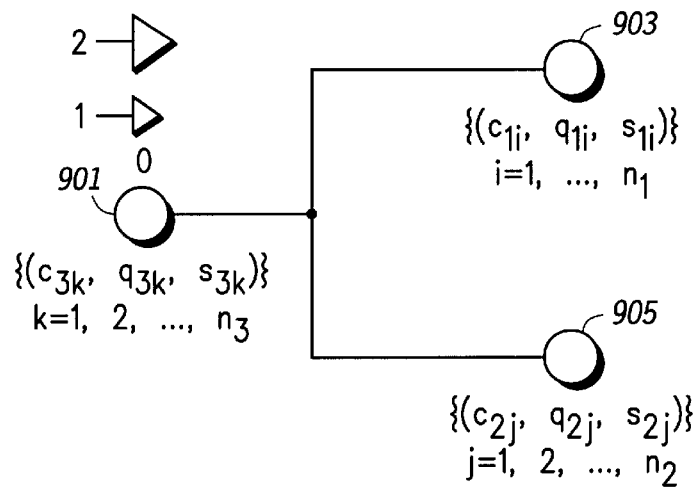
FIG. 9 is a schematic diagram illustrating exemplary calculation of one or more sets of capacitance, arrival time and slew rate at a candidate location based on descendant candidate locations, each with one or more sets of calculated capacitance, arrival time and slew rate values.

FIG. 9 is a schematic diagram illustrating the more general case for determination of possible sets of (c, q, s) values at an exemplary candidate location 901 for two exemplary descendant candidate locations 903 and 905. The (c, q, s) values were previously determined at each of the descendant candidate locations 903, 905 in a similar manner as described for the candidate location 801. Once the possible combinations are determined for the descendant candidate locations 903 and 905, the (c, q, s) values for the current candidate location 901 are then considered based upon the calculations at the candidate locations 903 and 905.

As shown in FIG. 9, the (c, q, s) values at the candidate location 903 are represented as $(c_{1i}, q_{1i}, s_{1i})$, where the index i=1, 2, ..., $n_1$, for $n_1$ sets of values at the candidate location 903. Likewise, the (c, q, s) values at the candidate location 905 are represented as $(c_{2j}, q_{2j}, s_{2j})$ where j=1, 2, ..., $n_2$ for $n_2$ sets of values at the, candidate location 905. The possible sets of values at the candidate location 901 are likewise represented as $(c_{3k}, q_{3k}, S_{3k})$, where k=1, 2 ..., $n_3$ for $n_3$ possible sets of values at the candidate location 901. Again, three repeater sizes 0, 1 and 2 are considered for the candidate location 901, where zero (0) represents placing no repeater at all.

In a mathematical sense, the possible combinations for $n_3$ could potentially be $n_1 \times n_2 \times m$, where m represents the possible repeater choices, which is 3 for 2 repeaters. It is noted, however, that the capacitance of a selected repeater is constant so that a worse case situation is $n_3 = n_1 \times n_2 + m$. It has been shown, however, that many suboptimal solutions may be pruned or eliminated, so that the worse case situation is $n_3 = n_1 + n_2 + m$. Further pruning is possible for the $n_3$ cases of $(c_{3k}, q_{3k}, s_{3k})$ values by arranging these sets in ascending order of capacitance. The resulting list is scanned in ascending order, and sets having a larger capacitance and smaller q values are eliminated or pruned. In general, for a first set in the list $(c_1, q_1)$ and a second set $(c_2, q_2)$ where $c_2 > c_1$, then if $q_2 < q_2$, then the $(c_2, q_2)$ set is pruned as a suboptimal choice.

Figure 10:
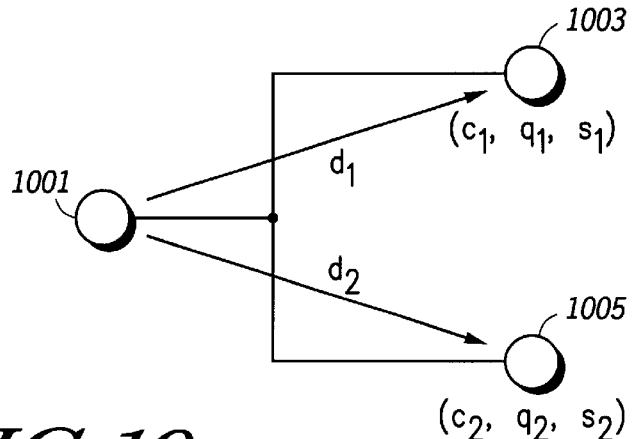
FIG. 10 is a schematic diagram illustrating exemplary calculation of arrival time at a candidate location based on particular capacitance, arrival time and slew rates of descendant candidate locations.

FIG. 10 is a schematic diagram more particularly illustrating the selection process described in FIGS. 8 and 9 for calculation of arrival time q. In particular, the q value at a candidate location 1001 is determined based upon descendant nodes 1003 and 1005, where the nodes 1003 and 1005 represent either sinks or descendant candidate locations. A particular set $(c_1, q_1, s_1)$ is selected at the node 1003 and another set $(c_2, q_2, s_2)$ is chosen at the node 1005. A delay value d1 is calculated between the candidate location 1001 and node 1003 and another delay value d2 is calculated between the candidate location 1001 and the node 1005 for a selected repeater.

Figure 11:
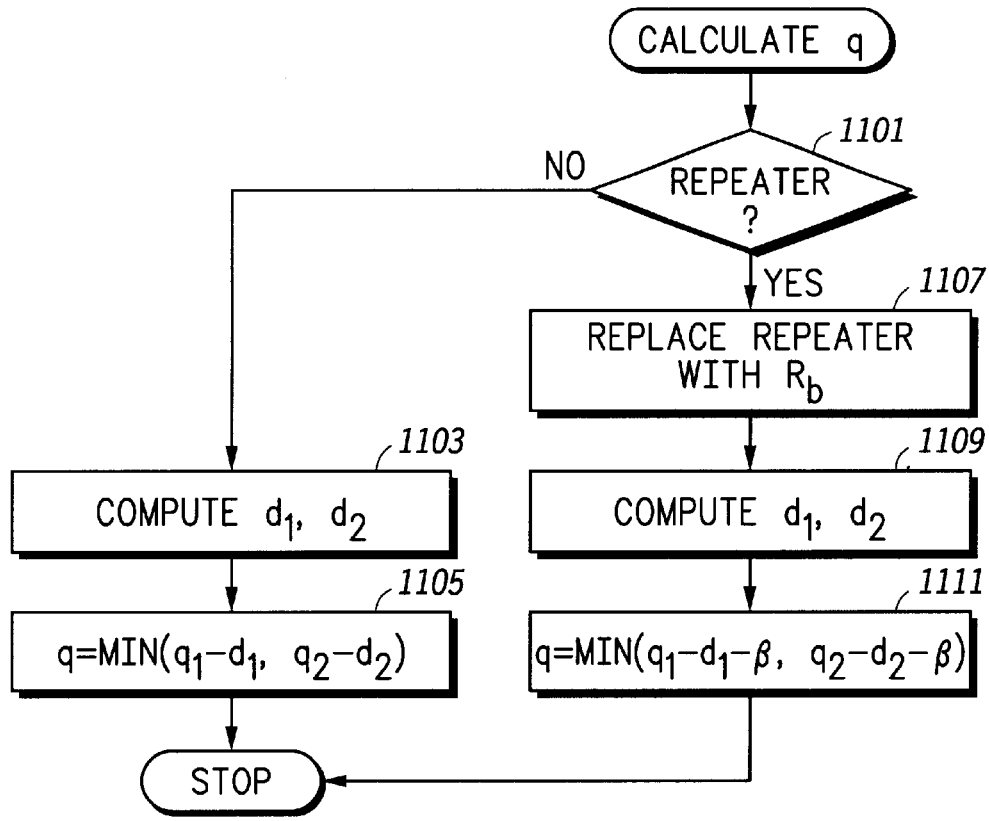
FIG. 11 is a flow chart diagram illustrating exemplary calculation of signal arrival time of the candidate location illustrated in FIG. 10.

FIG. 11 is a flowchart diagram illustrating the calculation of the q value at the candidate location 1001 shown in FIG. 10. At a first block 1101, it is determined whether a repeater is being considered or not at the candidate location 1001. If not, the values d1 and d2 are computed at the next block 1103 in a similar manner as previously described. At next block 1105, the q value is determined according to the following equation 1:

$$q = \min(q1-d1, q2-d2) \qquad (1)$$

where the min function chooses the lesser of the included expressions within the parenthesis. When a repeater is considered at block 1101 for the candidate location 1001, operation instead proceeds to block 1107 where the characteristic resistance of the repeater, referred to as $R_b$, is inserted at the candidate location 1001. At next block 1109, the d1 and d2 values are calculated using $R_b$ at the candidate location 1001. At next block 1111, the q value is calculated according to the following equation 2:

$$q = \min(q1-d1-\beta, q2-d2-\beta) \qquad (2)$$

where β may incorporate any number of parameter and repeater considerations. In a first embodiment, β is equal to a minimum return per repeater (mrpr) value which may be determined experimentally. For example, mrpr may represent a threshold delay, such as 70 ps or the like. In this embodiment, a repeater would not be inserted at the candidate location if the delay is not reduced by at least the threshold amount of 70 ps. In another embodiment, β is equal to mrpr+$db_f$, where $db_i$ represents the intrinsic delay of the selected repeater. And yet in further embodiments β may incorporate additional criteria such as further characteristics of the repeater, such as size, power, etc. Each of these factors may further be subject to a weighting function where the factors are discriminated relatively to the other factors.

The β value effectively discriminates for the use of some repeater sizes versus other repeater sizes, such as favoring no repeater or smaller repeaters over larger repeaters. Such is desired in many cases since repeaters consume power and valuable real estate on the IC. The β value may be adjusted or determined on a case by case basis depending on circuit considerations for a particular design.

Figure 12:
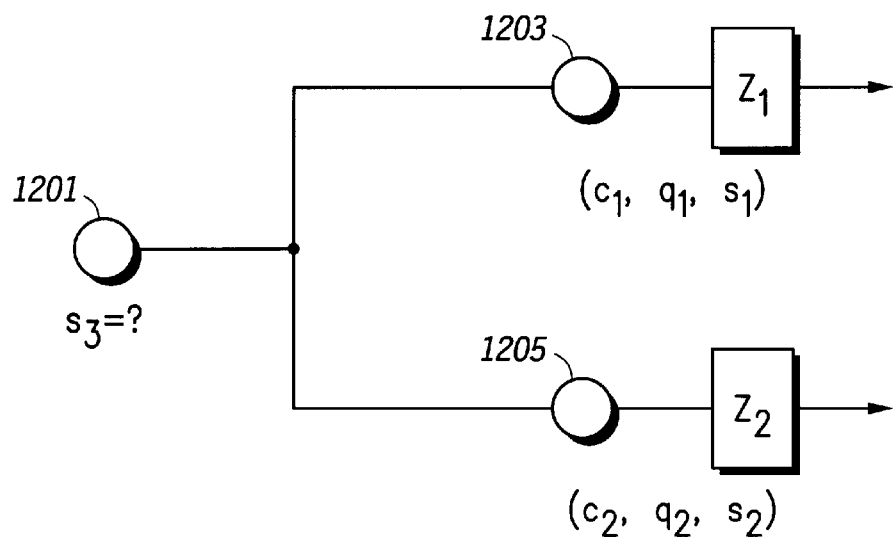
FIG. 12 is a schematic diagram illustrating exemplary calculation of slew rate at a representative candidate location based on capacitance, arrival time, and slew rate at two descendant nodes and further including consideration of downstream impedance.

FIG. 12 is a schematic diagram illustrating calculation of slew rate $s_3$ at a candidate location 1201. With respect to two descendant nodes 1203 and 1205. In a similar manner described above with reference to FIG. 10, the nodes 1203 and 1205 may each represent either sinks, such as the sinks 803 and 805 shown in FIG. 8, or downstream candidate locations, such as candidate locations 903 and 905 shown in FIG. 9. For sink nodes, the (c, q, s) values are already known. For candidate location nodes, any particular (c, q, s) values are selected at the nodes 1203 and 1205 for determining the corresponding slew rate $s_3$ at the candidate location 1201 for that particular selected combination. Thus, the values at the node 1203 are selected as $(c_1, q_1, s_1)$ and the values at node 1205 are selected at values $(c_2, q_2, s_2)$.

Figure 13:
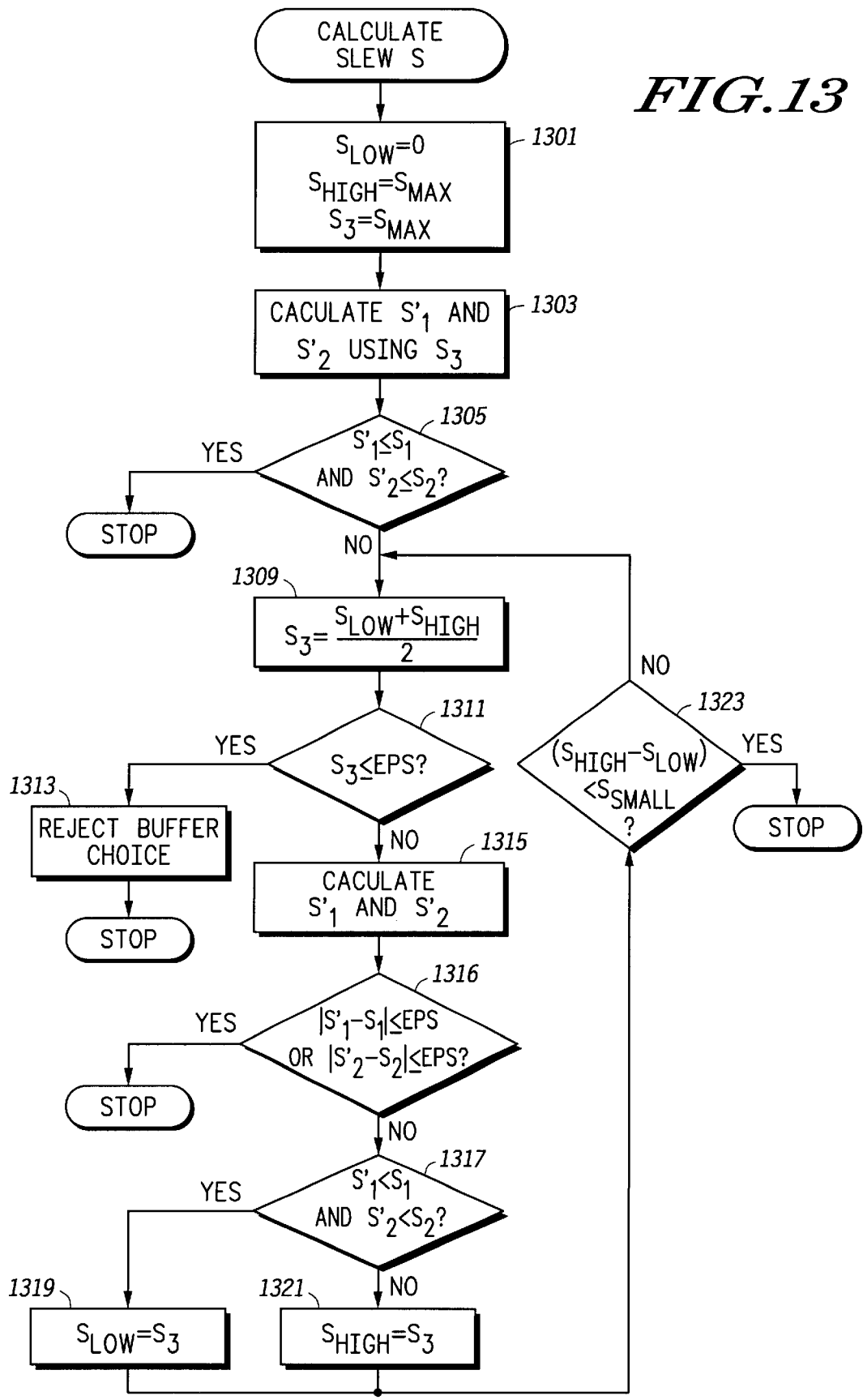
FIG. 13 is an flow chart diagram illustrating exemplary calculation of slew rate at the candidate location illustrated in FIG. 12.

FIG. 13 is a flow chart diagram illustrating calculation of the slew rate $s_3$ at the candidate location 1201 with reference to FIG. 12. At a first block 1301, an $s_{LOW}$ value is initially set to zero and an $s_{HIGH}$ value is initially set to $s_{MAX}$, where the $s_{LOW}$ and $s_{HIGH}$ values are used in a successive approximation technique to converge on a specific value for $s_3$ or otherwise to converge towards zero. Also at block 1301, $s_3$ is initially set to $s_{MAX}$. Operation proceeds to block 1303 in which new values for $s_1$ and $s_2$, referred to as $s_1'$ and $s_2'$, are calculated using 53, which in the first iteration is equal to $s_{MAX}$. In order to calculate slew rates, a more accurate modeling system of the circuit is used. In particular, a computer modeling program, such as the SPICE program, may be used which is a timing tool for more specifically representing the circuit relative to the nodes 1203 and 1205. SPICE is a particularly accurate tool and leads to correct results but may be computationally intensive. Instead, reduced order models may be used, called RICE models, which are a slight compromise but give a good idea of actual circuit representations. Computations using RICE are performed significantly faster than SPICE. The RICE models are used to calculate the impedances of the subtrees downstream from nodes 1203 and 1205, respectively. In particular, the downstream impedance at node 1203, referred to as $Z_1$, is calculated and the downstream impedance at node 1205, referred to as $Z_2$, is calculated. Using the RICE models, a value for the slew rate $s_3$ at the node 1201 is calculated that will not violate the maximum slew rate requirements $s_1$, and $s_2$ at the nodes 1203 and 1205, respectively.

After the $s_1'$ and $s_2'$ values are calculated at block 1303 using the current value of $s_3$, operation proceeds to decision block 1305 in which the values $s_1'$ and $s_2'$ are compared to $s_1$ and $s_2$, respectively. If $s_1'$ is less than or equal to $s_1$, and $s_2'$ is less than or equal to $s_2$, operation is completed. In this case, $s_3$ is equal to $s_{MAX}$ so that $s_{MAX}$ is the slew rate used at the node 1201 for the particular combination of (c, q, s) values at nodes 1203 and 1205. If, however, either of the conditions is violated at decision block 1305, operation proceeds to block 1309 in which $s_3$ is modified to a new value. In particular, $s_3$ is set equal to $(s_{LOW}+s_{HIGH})/2$. Thus, in the first iteration, $s_3$ is set to $s_{MAX}/2$. At next decision block 1311, it is determined whether $s_3$ is less than or equal to Epsilon (EPS), which is a very small slew value effectively equivalent to zero. The EPS value is used to prevent an infinite loop as zero will never actually be reached. However, if $s_3$ is tending towards zero and falls below the EPS value, then $s_3$ is considered too small and operation proceeds to next block 1313, at which the particular repeater choice is rejected and pruned because it results in a slew value that is too small to be achieved. In effect, the repeater choice at the candidate location 1201 is rejected.

If, however, $s_3$ has not fallen at or below the EPS value, operation proceeds to block 1315 where new values of $s_1'$ and $s_2'$ are calculated based on the new value of $s_3$. Operation then proceeds to next block 1317 where the $s_1'$ and $s_2'$ values are compared to $s_1$ and $s_2$, respectively, in a similar manner as at block 1305. In this case, however, it is determined whether $s_1'<s_1$, and whether $s_2'<s_2$. If these conditions are met, operation proceeds to block 1319 at which $s_{LOW}$ is set equal to $s_3$. In this case, during the first iteration, the possible slew rate range is reduced to $s_{MAX}/2$ to $s_{MAX}$ since $s_{LOW}$ is now equal to $s_{MAX}/2$.

On the other hand, if either of the conditions at block 1317 is violated, operation instead proceeds to block 1321, where $s_{HIGH}$ is set equal to $s_3$. In this case, during the first iteration, $s_{LOW}$ is still zero whereas $s_{HIGH}$ is set equal to $s_{MAX}/2$, giving a slew rate range of 0 to $s_{MAX}/2$. From either block 1319 or 1321, operation proceeds to block 1323, where the difference between $s_{HIGH}$ and $s_{LOW}$ is compared to a value $s_{SMALL}$ which determines when to exit the loop. In accordance with the binary search, once $s_{HIGH}$ and $s_{LOW}$ have closed to within $s_{SMALL}$, it is determined that $s_3$ has adequately converged on a relatively accurate calculation of the required slew at the candidate location 1201 in order to meet the required slew rates $s_1$ and $s_2$ at the nodes 1203 and 1205, respectively. Thus, $s_{LOW}$ is subtracted from $s_{HIGH}$ and compared to $s_{SMALL}$. If the difference is less than $s_{SMALL}$, then operation is completed and the current value of $s_3$ is used at the candidate location 1201. Otherwise, if the difference in the $s_{HIGH}$ and $s_{LOW}$ values is equal to or greater than $s_{SMALL}$, operation proceeds back to block 1309 to initiate another loop. It is noted that $s_{SMALL}$ may be equal to EPS.

During subsequent iterations of the binary search procedure, $s_3$ is set equal to the midpoint between $s_{LOW}$ and $s_{HIGH}$, new values of $s_1'$ and $s_2'$ are calculated and compared to $s_1$ and $s_2$, respectively, either of the $s_{LOW}$ or $s_{HIGH}$ values are set equal to the midpoint based on the comparison, and the process is repeated until $s_3$ either becomes too small, as determined at block 1311, or converges close enough to an actual slew value, as determined at block 1323.

Referring back to FIG. 4, after the (c, q, s) values are calculated at block 421, operation proceeds to block 423 to prune suboptimal and invalid choices. Invalid choices are determined as those in which the slew rate for a repeater choice or no repeater becomes too low as determined at block 1311 such that the repeater choice is considered invalid. Repeater choices are further pruned by evaluating the capacitance c and arrival times q. In particular, all of the calculated (c, q, s) values are arranged in ascending order of capacitance c. Then, between any two sets in which the capacitance of a second set is greater than the capacitance of a first set and where the q value of the second set is less than that of the first set, then the second set is considered a suboptimal choice and is pruned and discarded from consideration. In particular, for two sets of values $(c_1, q_1)$ and $(c_2, q_2)$, where $c_2>c_1$ and $q_2<q_1$, then the $(c_2, q_2)$ values are rejected and pruned. In this manner, a significant number of potential repeater choices are discarded because they would not provide the best choice among the particular choices being considered at any given candidate location.

After suboptimal and invalid choices are pruned at block 423, operation proceeds back to block 417 to traverse the net tree to the next valid candidate location according to the bottom-up procedure. Recall that some of the initial candidate locations 201–223 may be pruned so that they are no longer valid. Ultimately, the source device of the net is reached as determined at block 419. For example, for the net 100, after consideration of the candidate location 223, the source device 101 is reached. Once this occurs, the bottom-up procedure is completed for the particular iteration and operation proceeds to block 425 in which the (c, q, s) values are calculated at the source device 101 using the source resistance $R_s$, referred to as $(c_s, q_s, s_s)$. In general, this calculation is exactly the same as for any candidate location except that there are no repeater choices at the source other than the source device 101 itself. For the net 100, the resistance $R_s$ of the source device 101 is utilized to calculate the $(c_s, q_s, s_s)$ values at the source device 101 using the calculated sets of (c, q, s) values at the one or more descendant nodes of the source. For the net 100, the values at the candidate location 223, if not already eliminated, would be used.

After the $(c_s, q_s, s_s)$ values are calculated at the source location, the set of (c, q, s) values at the descendant node(s) that provide the maximum q value at the source is selected at block 426. The maximum q value is selected because it represents the best timing choice for the net 100. Then, those (c, q, s) values at the one or more subordinate candidate locations are selected at block 427 in a top-down traversal to identify the best solution for the net 100. In this manner, the top-down traversal selects the appropriate (c, q, s) values at the remaining and valid descendant locations that provide the best q value at the candidate parent locations. The entire net is traversed in a top-down procedure in this manner so that one set of (c, q, s) values is selected from among the choices at each remaining and valid candidate location. Once the procedure is completed, it is determined that the best solution, given the particular constraints previously described, has been determined for that particular net. It is noted that this best solution may not be the optimal solution in the most general case, but is the best solution given the practical considerations described herein.

After the top-down traversal of the net has been performed at block 427, operation proceeds to block 429 in which it is determined whether legal repeater sizes have been selected and utilized. If so, then operation is complete and the selected repeaters are placed at the valid candidate locations. However, as previously described, midvalues may have been used so that the resulting repeater sizes are not legal. In this case, operation loops back to block 413, where the next set of repeater sizes is selected. For example, for the repeater sizes 10–80 shown in FIG. 5, if the midvalue repeater sizes 505 were used in the bottom-up traversal, then the next set of mid value repeater sizes 503 are then utilized in the next iteration. After the bottom-up procedure is completed for the midvalue repeater sizes 503, and after the top-down traversal at block 427, then it is determined that the remaining repeater sizes are still not legal since using midvalue repeater sizes 503. Operation loops back for a last iteration of the bottom-up procedure in which case the legal repeater sizes 10–80 are utilized. After the bottom-up procedure is completed and then after the top-down traversal is completed at block 427 for the final iteration, then it is determined that legal repeater sizes have been used at block 429. After the set of legal repeater sizes has been considered and locations are selected, then the solution has been determined. The selected repeaters are inserted into the selected locations to achieve a net that operates within the required timing parameters.

Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A method for placing repeaters in a network in an integrated circuit comprising:

identifying repeater location candidates in the network;

determining a first set of repeaters of a first repeater size and a second repeater size;

calculating delays using the first set of the first repeater size and the second repeater size;

for each candidate location, determining which of no repeater, the first repeater size, or the second repeater size is optimum;

determining a second set of repeaters of a third repeater size and a fourth repeater size;

determining a third set of repeaters of a fifth repeater size and a sixth repeater size;

calculating delays using the second set of repeaters for repeater location candidates in which the first size was optimum and the third set for repeater location candidates in which the second size was optimum;

determining which of the third and fourth sizes is optimum;

determining which of the fifth and sixth sizes is optimum; and making the integrated circuit using repeaters of a size closer to the third size than the fourth size for repeater location candidates which were optimum for the third size.

2. A method for selecting a repeater size for a repeater in a network:

obtaining a set of possible repeater sizes;

defining a first plurality of legal subsets of at least two sizes of the legal set of repeater sizes, each subset of repeater sizes having consecutive sizes;

computing a representative size for each subset of the plurality of subsets to form a first plurality of experimental subsets of repeater sizes;

subsequently recursively defining additional experimental subsets from the previous computing step and computing representative sizes for the additional experimental subsets from the previous defining step until a final experimental subset of sizes is obtained;

experimenting with the legal subsets and the experimental subsets to determine a selected size present in the legal subset which is nearest optimum; and making an integrated circuit with the repeater having the selected size.

3. The method of claim 2, wherein the number of defining steps is three.

4. A method for placing repeaters in a network in an integrated circuit comprising:

identifying repeater location candidates in the network;

determining a first set of repeaters of at least two repeater sizes; calculating delays using the first set of repeaters at the repeater location candidates;

determining which of the repeater sizes in the first set of repeaters is optimum for each repeater candidate location;

determining a plurality of second sets of repeaters wherein each of the second sets corresponds to one of the repeater sizes in the first set of repeaters and each of the second sets has at least two repeater sizes in which at least one repeater size is different from all the repeater sizes in another second set;

calculating delays using the second sets, wherein the second set used at each repeater location candidate is the one which corresponds to the repeater size from the first set which was determined to be optimum for that repeater location candidate;

determining which repeater size from the repeater sizes from the second sets is optimum for each repeater location candidate; and making the integrated circuit with repeaters at the repeater location candidates in which each repeater is a repeater size which is closer to the repeater size from the second sets which was determined to be optimum for that repeater location candidate than any other repeater size from the second sets.

\* \* \* \* \*